United States Patent [19]

Shimada et al.

[11] Patent Number: 5,712,601
[45] Date of Patent: Jan. 27, 1998

[54] OSCILLATION CIRCUIT

[75] Inventors: Yoshikazu Shimada; Isoshi Takeda, both of Kyoto, Japan

[73] Assignee: Rohm Co. Ltd., Kyoto, Japan

[21] Appl. No.: 603,869

[22] Filed: Feb. 22, 1996

[30] Foreign Application Priority Data

Feb. 28, 1995 [JP] Japan ................. 7-038907

[51] Int. Cl.$^6$ .................................. H03B 5/24
[52] U.S. Cl. ............... 331/177 R; 331/57; 331/108 B; 331/135
[58] Field of Search ............... 331/177 R, 57, 331/108 B, 135

[56] References Cited

U.S. PATENT DOCUMENTS

| | | | |
|---|---|---|---|
| 4,818,952 | 4/1989 | Kawano et al. | 331/108 R |
| 5,142,249 | 8/1992 | Hirotomi | 331/57 |
| 5,206,609 | 4/1993 | Mijuskovic | 331/57 |
| 5,384,553 | 1/1995 | Takeda et al. | |
| 5,406,631 | 4/1995 | Takeda et al. | |
| 5,450,039 | 9/1995 | Takeda et al. | |
| 5,552,749 | 9/1996 | Nowatski et al. | 331/14 |

*Primary Examiner*—Timothy P. Callahan
*Assistant Examiner*—An T. Luu
*Attorney, Agent, or Firm*—Nikaido, Marmelstein, Murray & Oram LLP

[57] ABSTRACT

An oscillation circuit is provided which is easily adjusted with a high degree of accuracy. The oscillation circuit including a filter having a time constant and an inverting amplifier which feeds back the output of the filter to the input side of the filter so that an oscillation condition is fulfilled. The filter includes a gm amplifier formed of a differential amplifier, and a capacitor. The constant current source of the differential amplifier is connected to a free running oscillation frequency adjusting circuit. The adjusting circuit includes a microcomputer, a decoder which decodes the output data of the microcomputer and a switching circuit driven by the output of the decoder and varying the current value according to the output of the decoder. A current in accordance with a current value depending on the setting of the switch flows through the constant current source.

4 Claims, 4 Drawing Sheets

OSCILLATION CIRCUIT

BACKGROUND OF THE INVENTION

1. Field of the Invention

The present invention relates to an oscillation circuit for use in compact disk players and portable telephones.

2. Description of the Prior Art

Such an oscillation circuit typically utilizes a quartz oscillator. However, since small size apparatuses such as portable telephones are extremely crowded with parts inside, an oscillation circuit is desired which requires only a minimum space. Moreover, there is a problem that the quartz oscillator is costly. On the other hand, oscillation circuits not utilizing the quartz oscillator have been proposed. Such type of oscillation circuits include a CR oscillation circuit constituted by a dynamic resistor of a transistor and a capacitor.

The CR oscillation circuit is formed as an integrated circuit (IC) and the manufacture of the ICs causes variations in performance among the products. Therefore, it is necessary for its initial frequency (free running oscillation frequency) to have been adjusted. For this purpose, a method has been proposed in which a plurality of transistors having their output electrodes connected to each other through a conductor are provided as an adjusting circuit which adjusts the constant current of a differential amplifier forming the oscillation circuit and the conductor is laser-trimmed to set the output current value of the adjusting circuit. According to this method, however, the adjustment is not easy and the sufficient degree of accuracy is difficult to obtain. Therefore, it is impossible to adjust a variation of 16% with an accuracy of 1 PPM in a portable telephone having an initial frequency of 15.36 MHz.

SUMMARY OF THE INVENTION

An object of the present invention is to provide an oscillation circuit being easily adjusted with a high degree of accuracy.

To achieve the above-mentioned object, according to the present invention, an oscillation circuit is provided with a filter having a time constant and means for feeding back an output of the filter to an input side of the filter so that an oscillation condition is fulfilled. The filter includes a gm amplifier formed of a differential amplifier, and a capacitor. A constant current source of the differential amplifier is connected to a free running oscillation frequency adjusting circuit. The adjusting circuit includes a microcomputer, a decoder which decodes output data of the microcomputer and a switching circuit driven by an output of the decoder and varying a current value according to the output of the decoder. A current in accordance with a current value depending on a setting of the switching circuit flows through the constant current source.

According to such features, a variation in oscillation frequency is calculated by inputting the frequency of the oscillation circuit to the microcomputer. Adjustment data corresponding to the variation is outputted from the microcomputer. The data is decoded by the decoder and the switching circuit is driven by the decoded output, so that a switching condition in accordance with the adjustment data is realized. The output current of the switching circuit is reflected in the constant current of the differential amplifier. Since the conducting resistor of the differential amplifier is concerned with the oscillation frequency, the frequency is adjusted by this circuit. The accuracy of the adjustment depends on the bit number of the adjustment data. Upon completion of the adjustment, the data is stored, for example, in a non-volatile memory formed in the microcomputer or formed in an IC chip where the microcomputer is formed.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
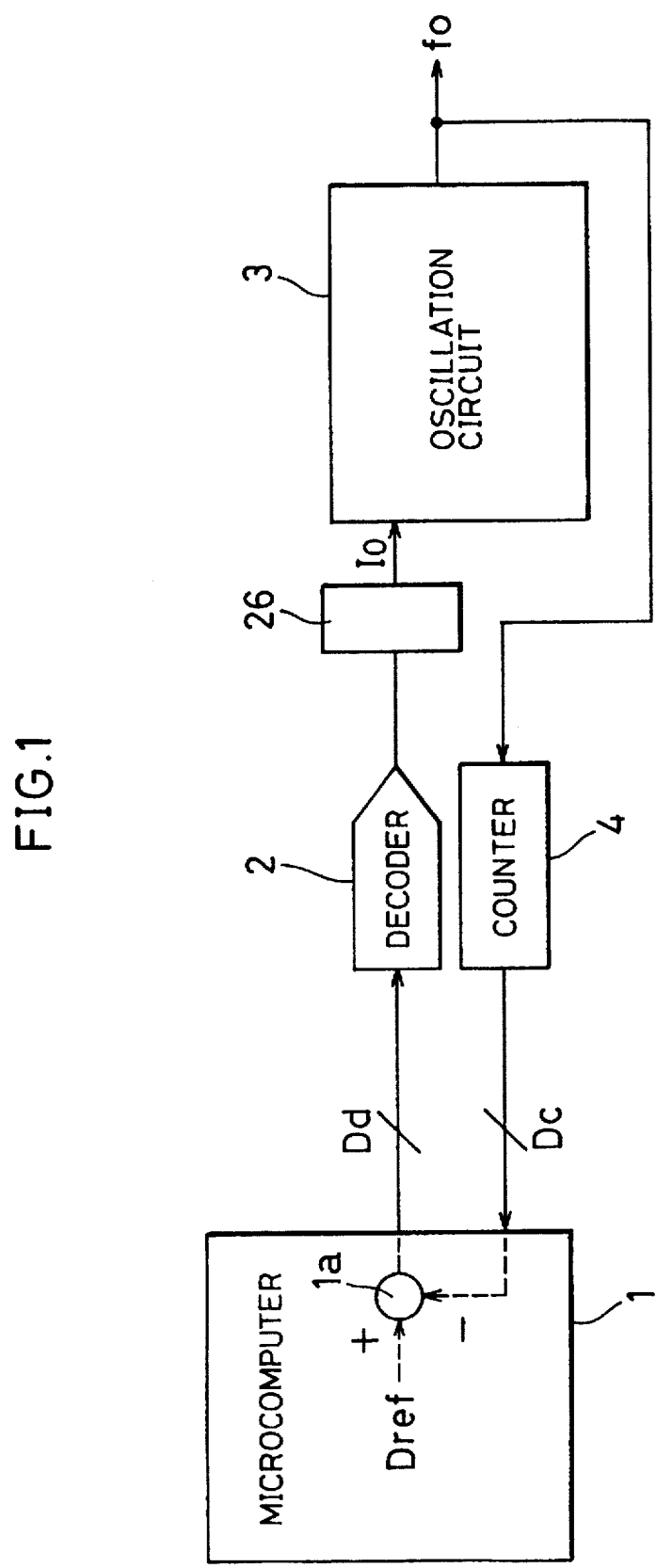
FIG. 1 is a block diagram showing a frequency adjusting circuit portion of an oscillation circuit embodying the present invention.

Hereinafter, an embodiment of the present invention will be described with reference to the drawings. Referring to the block diagram of FIG. 3, there is shown the general arrangement of a voltage controlling oscillation circuit (VCO). Reference numerals 20 and 21 are filters (charging and discharging circuits). Reference designation gm represents a variable gm amplifier. Reference designations C1 and C2 represent capacitors. Reference numeral 22 represents an inverting amplifier. Reference numeral 23 represents a control voltage input terminal. Reference numeral 24 represents a voltage-to-current converting circuit. Reference numeral 44 represents an adjusting circuit including a microcomputer 1, a decoder 2 and a switching circuit 26. Reference numeral 25 represents an adder which adds the output currents of the voltage-to-current converting circuit 24 and the adjusting circuit 44. (A) and (B) are oscillation signal outputs of which phases differ by 90° from each other.

Figure 2:
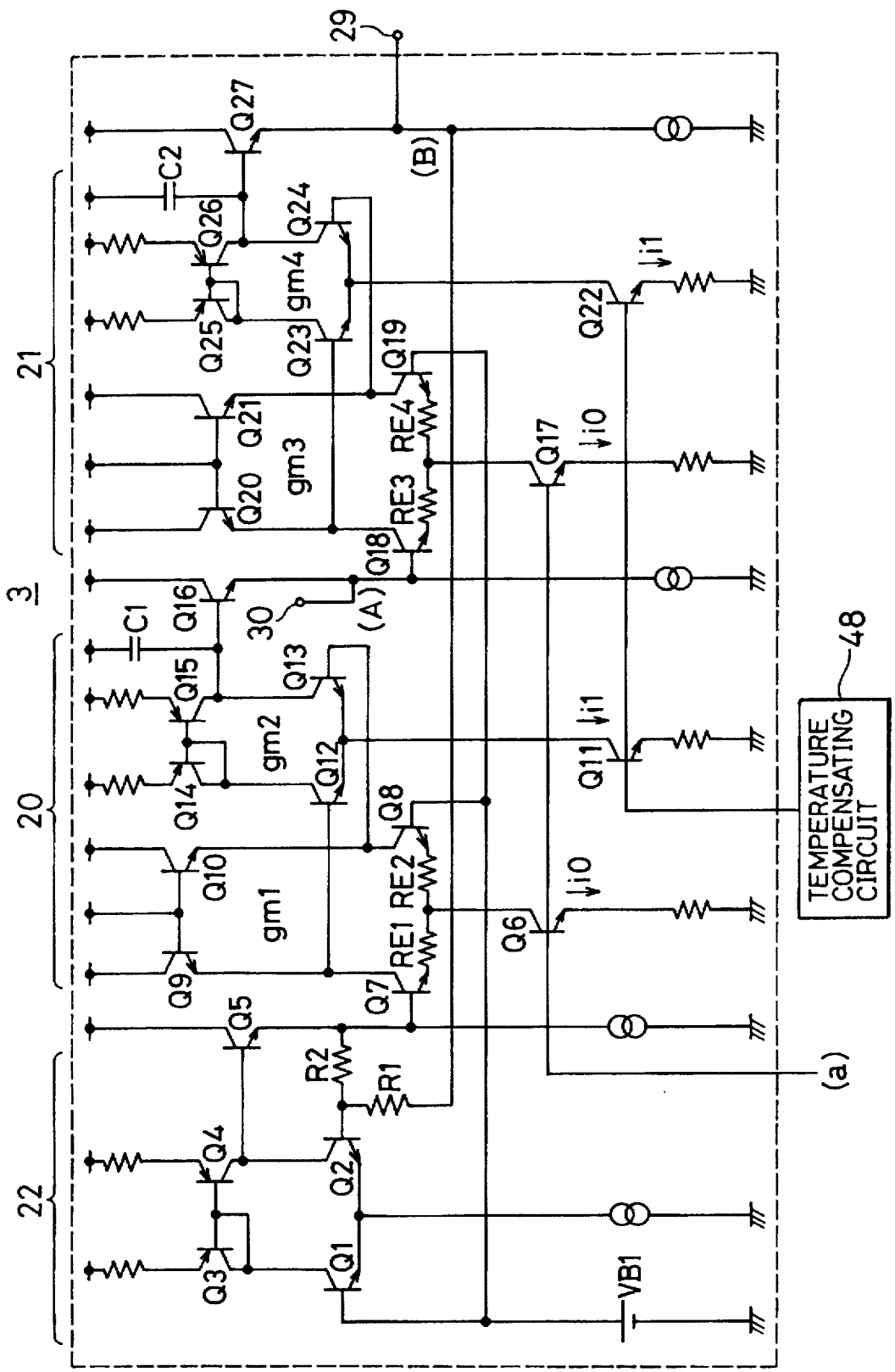
FIG. 2 is a circuit diagram showing an oscillation circuit portion of the circuit.
Figure 3:
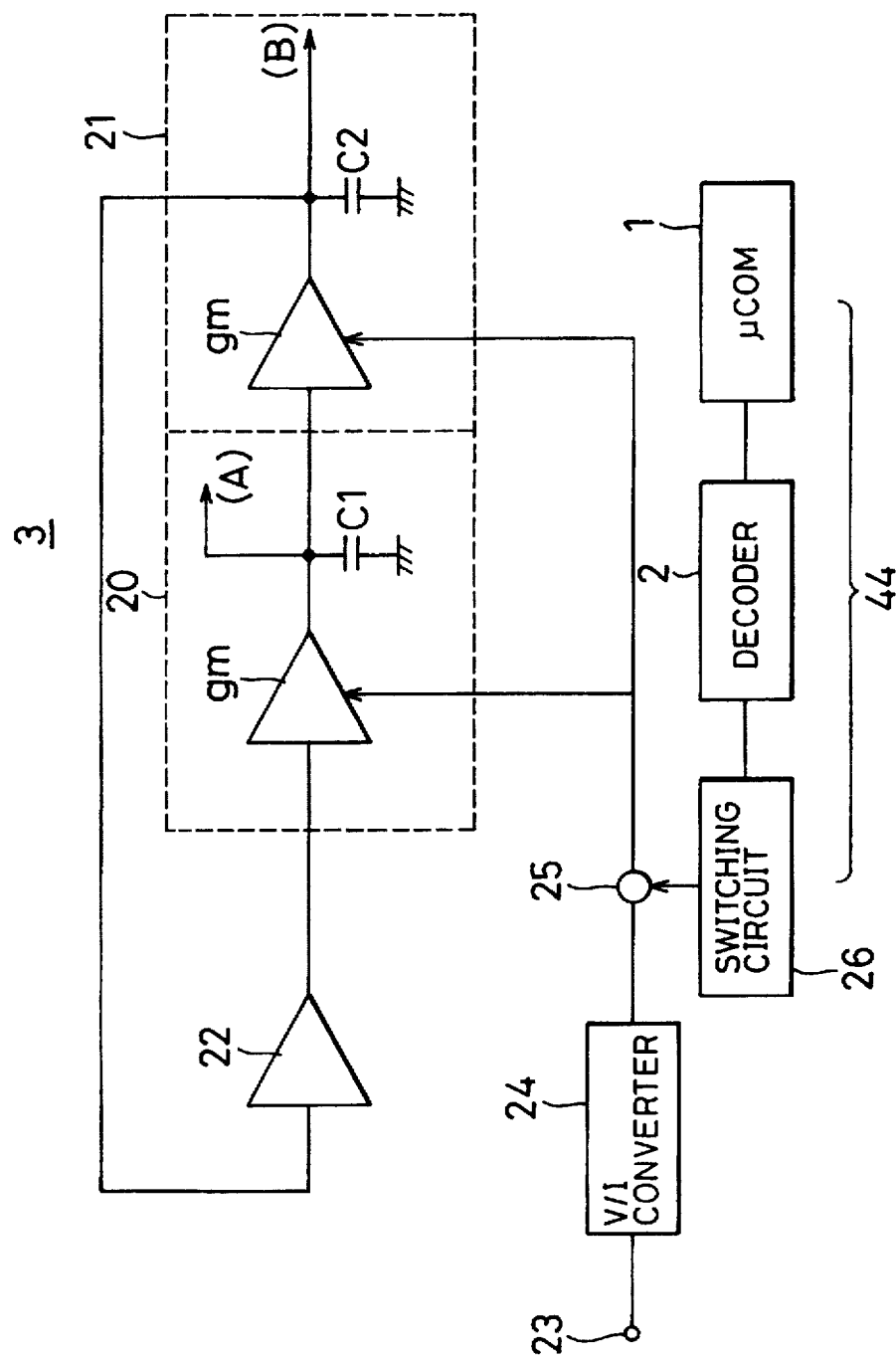
FIG. 3 is a block diagram showing the general arrangement of a voltage controlling oscillation circuit embodying the present invention.

Referring to FIG. 2, there is shown the arrangement of the oscillation circuit 3 in detail. As also shown in FIG. 3, the oscillation circuit 3 includes, in addition to the filters 20 and 21, the inverting amplifier 22 with an amplification degree of 1 which inverts the output of the filter 21 by 180° and supplies it to the input side of the filter 20. The filter 20 is formed as a low pass filter including a pair of gm amplifiers gm1 and gm2 connected as shown in the figure and the capacitor C1. Moreover, the filter 21 is formed as a low pass filter including a pair of gm amplifiers gm3 and gm4 and the capacitor C2.

The gm amplifiers gm1 to gm4 are all formed of differential amplifiers. The output (B) of the output terminal 29 is inverted by the inverting amplifier 22 and inputted to the base of a transistor Q7 of the gm amplifier gm1 with a phase difference of 180° from the phase of the output (B). The output of the gm amplifier gm1 is directed from the output of a transistor Q15 of the succeeding gm amplifier gm2 to the emitter of an emitter follower Q16 where the phase is 90° ahead of the phase at the base of the transistor Q7.

After having passed through the gm amplifiers gm3 and gm4, the output signal (A) of the gm amplifier gm2 is directed to the emitter side of an emitter follower Q27. The phase at the emitter is further 90° ahead of the phase at the emitter of the transistor Q16. That is, the pairs of gm amplifiers each phase-shift the input by 90°. Consequently, the phase is shifted by 180° by the two pairs of gm amplifiers. The output is further inverted by 180° by the inverting amplifier 22 and fed-back to the gm amplifier gm1. Thus, an oscillation is realized. The terminals 29 and 30 are for taking the oscillation output.

The capacitances of the capacitor C1 and the capacitor C2 are equal to each other and C1=C2=C. The emitter resistances RE1, RE2, RE3 and RE4 of the transistors Q7, Q8, Q18 and Q19 are equal to one another and RE1=RE2=RE3= RE4=RE. When a current flowing through the amplifiers gm1 and gm3 is i0 and a current flowing through the amplifiers gm2 and gm4 is i1, a free running oscillation frequency fo of a sine wave oscillation circuit 3 is expressed by $$fo = \frac{1}{2\pi} \cdot \frac{1}{RE \times C} \cdot \frac{i1}{i0} \quad (1)$$

Here, a capacitance C of the capacitor is prevented from being affected by the temperature by forming the capacitors C1 and C2 of nitride film. On the other hand, RE has a temperature characteristic. Therefore, if the temperature characteristic of i1/i0 is appropriately selected, the oscillation frequency f0 will have no temperature characteristic.

A temperature characteristic compensating circuit 48 is provided for this purpose. The current i1 is controlled by controlling transistors Q11 and Q12 for the constant currents of the gm amplifiers gm2 and gm4 by the output of the temperature characteristic compensating circuit 48.

In the above expression (1), since RE, C and i1/i0 vary according to variations among the elements constituting the circuit, the oscillation frequency fo varies among the products. The oscillation frequency fo is controlled by a control voltage inputted from the terminal 23 shown in FIG. 3 so that an oscillation of a predetermined frequency is obtained. However, if the variation of the oscillation circuit 3 is great, it exceeds a control range and the oscillation of the predetermined frequency cannot be obtained.

In the present invention, it is the adjusting circuit 44 that curbs the variation by adjusting the constant current i0 (constant current in free running oscillation) of the gm amplifiers gm1 and gm3. Referring to FIG. 1, there is shown the adjusting circuit 44.

An oscillation output fo of the oscillation circuit 3 is supplied to a counter 4 where the frequency is detected. The detection signal is inputted to the microcomputer 1 in digital form. Then, the signal is compared with a reference frequency (corresponding to the initial frequency of the oscillator) by a comparator 1a and the comparison result is outputted as a digital value Dd. The digital value Dd is decoded by the decoder 2 to drive the succeeding switching circuit 26. In other words, the decoded output is converted into an analog current $I_0$ by the switching circuit 26. The current $I_0$ is supplied to a point (a) of the oscillation circuit 3 shown in FIG. 2 to vary the current i0 flowing through transistors Q6 and Q17 so that the oscillation frequency approaches the initial frequency.

Figure 4:
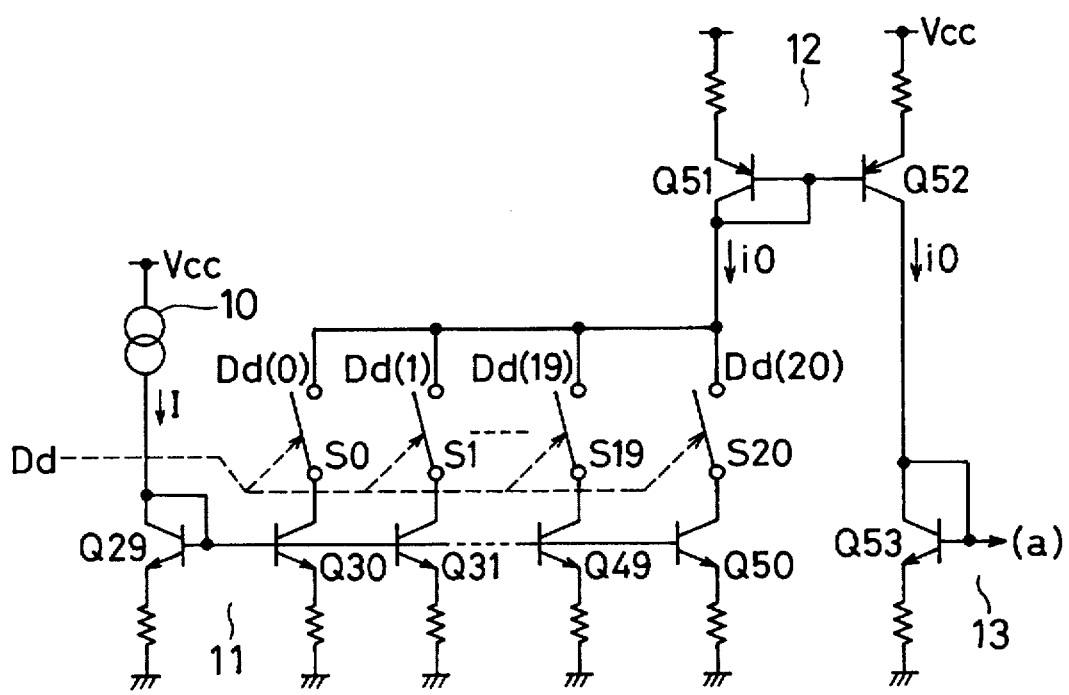
FIG. 4 is a circuit diagram showing a switching circuit portion of a frequency adjusting circuit of the circuit.

The switching circuit 26 is of a circuit arrangement as shown in FIG. 4. Reference numeral 10 represents a constant current source of which output current I is supplied to the base and collector of a transistor Q29 and to the bases of transistors Q30 to Q50. The transistor Q29 and the transistors Q30 to Q50 form a current mirror circuit 11.

The transistors Q30 to Q50 has their emitters connected to ground through resistors but have their collectors connected to the input terminal of a second current mirror circuit 12 through switches S0 to S20. The second current mirror circuit 12 is formed of PNP-type transistors Q51 and Q52. The output side transistor Q52 has its collector connected to the collector and base of an NPN-type transistor Q53.

The transistor Q53 has its base connected to the point (a) of the oscillation circuit 3 of FIG. 2. Thus, the transistor Q53 and the transistors Q6 and Q17 of the oscillation circuit 3 form a third current mirror circuit 13. The switches S0 to S20 are controlled by the signal Dd outputted from the microcomputer 1. The signal Dd is of 21 bits which serve as ON/OFF control signals for the switches S0 to S20, respectively. For example, when the first bit is 1, the switch S0 corresponding to the first bit is turned on and when the first bit is 0, the switch S0 is turned off.

When the oscillation circuit 3 is employed in a portable telephone, the desired frequency fo is 15.36 MHz. Assuming that the variation in fo caused in forming the circuits as ICs is 16%, in order to adjust the variation with an accuracy of 1 PPM (a millionth) or lower, the signal Dd is necessarily of 21 bit, so that 21 switches are necessary. That is, in order to adjust the variation of 16% with a necessary accuracy, the constant current of the oscillation circuit 3 is controlled by a signal of 21 bits. In the case of the portable telephone, a channel selecting control voltage is supplied to the terminal 23.

The oscillation circuit 3, the counter 4, the decoder 2 and the switching circuit 26 of FIG. 1 are formed within an IC chip of a circuit to which the oscillation circuit 3 is applied. The above-described adjustment is made when the IC is manufactured. The data of the adjusting means is stored in a non-volatile memory so that when the IC is turned on, the data is outputted from the microcomputer to set the switching circuit through the decoder. In that case, the counter 4 does not operate.

While in the above-described embodiment, the circuit of FIG. 1 is used for adjusting the variation caused when the oscillation circuit is formed as an IC, the circuit may be applied, for example, as the temperature compensating circuit 48 of FIG. 2. For example, correction values each corresponding to a temperature are previously stored in a data table attached to the microcomputer 1, and the output of a temperature detecting sensor (not shown) is inputted to the microcomputer 1 so that a predetermined correction value is taken out and used.

As described above, according to the present invention, the adjustment of the oscillation frequency is made easily and with an excellent degree of accuracy.

Obviously, many modifications and variations of the present invention are possible in light of the above teachings. It is therefore to be understood that within the scope of the appended claims, the invention may be practiced other than as specifically described.

What is claimed is:

1. An oscillation circuit comprising a filter having a time constant and means for feeding back an output of the filter to an input side of the filter so that an oscillation condition is fulfilled, wherein said filter includes a gm amplifier and a capacitor, said gm amplifier being formed of a differential amplifier, and wherein a constant current source of the differential amplifier is connected to a free running oscillation frequency adjusting circuit, said adjusting circuit including a microcomputer, a decoder which decodes output data of the microcomputer, and a switching circuit driven by an output of the decoder, said switching circuit varying a current value according to the output of the decoder, and wherein a current in accordance with a current value depending on a setting of the switching circuit flows through the constant current source.

2. An oscillation circuit according to claim 1, wherein said microcomputer outputs, when power is ON, data obtained when a free running oscillation frequency is adjusted.

3. An oscillation circuit according to claim 1, wherein said data is of a bit number necessary to adjust a variation in free running oscillation frequency in the oscillation circuit with an accuracy of 1 PPM or lower.

4. An oscillation circuit according to claim 3, wherein said oscillation circuit is a voltage controlling oscillation circuit for selecting a channel of a portable telephone and has a voltage-to-current converting circuit which converts a channel selecting control voltage into a current.

* * * * *